(12) United States Patent
Kim et al.

(10) Patent No.: US 8,212,242 B2
(45) Date of Patent: Jul. 3, 2012

(54) ORGANIC LIGHT EMITTING DIODE DISPLAY HAVING A CORNER-CUBE PATTERN COVER LAYER

(75) Inventors: Eun-Ah Kim, Yongin (KR); Soon-Ryong Park, Yongin (KR); Woo-Suk Jung, Yongin (KR); Hee-Chul Jeon, Yongin (KR); Noh-Min Kwak, Yongin (KR); Hee-Seong Jeong, Yongin (KR); Joo-Hwa Lee, Yongin (KR); Chul-Woo Jeong, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 115 days.

(21) Appl. No.: 12/588,801

(22) Filed: Oct. 28, 2009

(65) Prior Publication Data

US 2010/0155757 A1  Jun. 24, 2010

(30) Foreign Application Priority Data

Dec. 23, 2008 (KR) ........................ 10-2008-0132375

(51) Int. Cl.
| | |
|---|---|
| *H01L 29/08* | (2006.01) |
| *H01L 35/24* | (2006.01) |
| *H01L 51/00* | (2006.01) |
| *H01L 29/06* | (2006.01) |
| *H01L 31/0328* | (2006.01) |
| *H01L 31/0336* | (2006.01) |
| *H01L 31/072* | (2006.01) |
| *H01L 31/109* | (2006.01) |
| *H01L 29/04* | (2006.01) |
| *H01L 29/10* | (2006.01) |
| *H01L 31/036* | (2006.01) |
| *H01L 31/0376* | (2006.01) |
| *H01L 31/20* | (2006.01) |
| *H01L 29/15* | (2006.01) |
| *H01L 31/0312* | (2006.01) |
| *H01L 29/22* | (2006.01) |
| *H01L 33/00* | (2010.01) |

(52) U.S. Cl. ................ 257/40; 257/21; 257/59; 257/77; 257/95; 257/103; 257/E27.117; 257/E27.118; 257/E27.119; 257/E31.13; 257/E33.007; 257/E33.074; 257/E51.018; 257/E51.019

(58) Field of Classification Search .................... 257/40, 257/59, 77, 103, E27.117, E27.118, E27.119, 257/E33.007, E51.018, E51.019, 21, 95, 257/E31.13, E33.074
See application file for complete search history.

(56) References Cited

U.S. PATENT DOCUMENTS 5,742,411 A * 4/1998 Walters ............................ 359/2
(Continued)

FOREIGN PATENT DOCUMENTS

JP   08234183 A * 9/1996
(Continued)

*Primary Examiner* — Ida M Soward
(74) *Attorney, Agent, or Firm* — Robert E. Bushnell, Esq.

(57) ABSTRACT

The present invention relates to an OLED display, and an OLED display according to an exemplary embodiment of the present invention includes a substrate member, an OLED including a first electrode formed on the substrate member, an organic emission layer formed on the first electrode, and a second electrode formed on the organic emission layer, and a cover layer formed on the second electrode and covering the OLED. The cover layer includes a cover main body and a corner-cube pattern formed on an opposite side of a side that faces the second electrode among both sides of the cover main body.

17 Claims, 4 Drawing Sheets

U.S. PATENT DOCUMENTS

| | | | |
|---|---|---|---|
| 7,161,188 B2 * | 1/2007 | Orita | 257/98 |
| 7,339,197 B2 * | 3/2008 | Lin et al. | 257/95 |
| 7,439,938 B2 * | 10/2008 | Cho et al. | 345/1.3 |
| 7,514,717 B2 * | 4/2009 | Chen | 257/79 |
| 7,514,720 B2 * | 4/2009 | Kim et al. | 257/90 |
| 7,800,301 B2 * | 9/2010 | Ishikawa et al. | 313/509 |
| 7,939,349 B2 * | 5/2011 | Koide et al. | 438/22 |
| 7,960,910 B2 * | 6/2011 | Suh | 313/504 |
| 8,034,647 B2 * | 10/2011 | Batres et al. | 438/29 |
| 8,106,412 B2 * | 1/2012 | Takao et al. | 257/94 |
| 2003/0128318 A1 * | 7/2003 | Yoshii et al. | 349/114 |
| 2004/0080476 A1 * | 4/2004 | Tsai et al. | 345/82 |
| 2004/0087066 A1 * | 5/2004 | Voutsas | 438/147 |
| 2006/0197078 A1 * | 9/2006 | Yu | 257/40 |
| 2007/0018186 A1 * | 1/2007 | Shin et al. | 257/98 |
| 2007/0048886 A1 * | 3/2007 | Winters et al. | 438/29 |
| 2007/0153391 A1 * | 7/2007 | Chuang | 359/619 |
| 2007/0158729 A1 * | 7/2007 | Yang et al. | 257/306 |
| 2007/0284991 A1 * | 12/2007 | Egi et al. | 313/479 |
| 2008/0074743 A1 * | 3/2008 | Benson et al. | 359/530 |
| 2008/0130122 A1 * | 6/2008 | Egi et al. | 359/613 |
| 2008/0158682 A1 * | 7/2008 | Egi et al. | 359/601 |
| 2008/0203421 A1 * | 8/2008 | Bechtel et al. | 257/99 |
| 2008/0237779 A1 * | 10/2008 | Yamazaki et al. | 257/507 |
| 2008/0247065 A1 * | 10/2008 | Boyd et al. | 359/831 |
| 2008/0268209 A1 | 10/2008 | Woo et al. | 428/192 |
| 2009/0009057 A1 * | 1/2009 | Lee et al. | 313/503 |
| 2009/0046468 A1 | 2/2009 | Wang et al. | 362/297 |
| 2009/0231245 A1 * | 9/2009 | Lin | 345/77 |
| 2009/0278145 A1 * | 11/2009 | Sakai | 257/98 |
| 2010/0026930 A1 * | 2/2010 | Jepsen | 349/62 |
| 2010/0046249 A1 * | 2/2010 | Mai et al. | 362/620 |
| 2010/0176416 A1 * | 7/2010 | Kim et al. | 257/98 |
| 2010/0203661 A1 * | 8/2010 | Hodota | 438/29 |
| 2010/0264446 A1 * | 10/2010 | Niki et al. | 257/98 |
| 2011/0175130 A1 * | 7/2011 | Lee | 257/98 |

FOREIGN PATENT DOCUMENTS

JP  09133913 A  * 5/1997

* cited by examiner

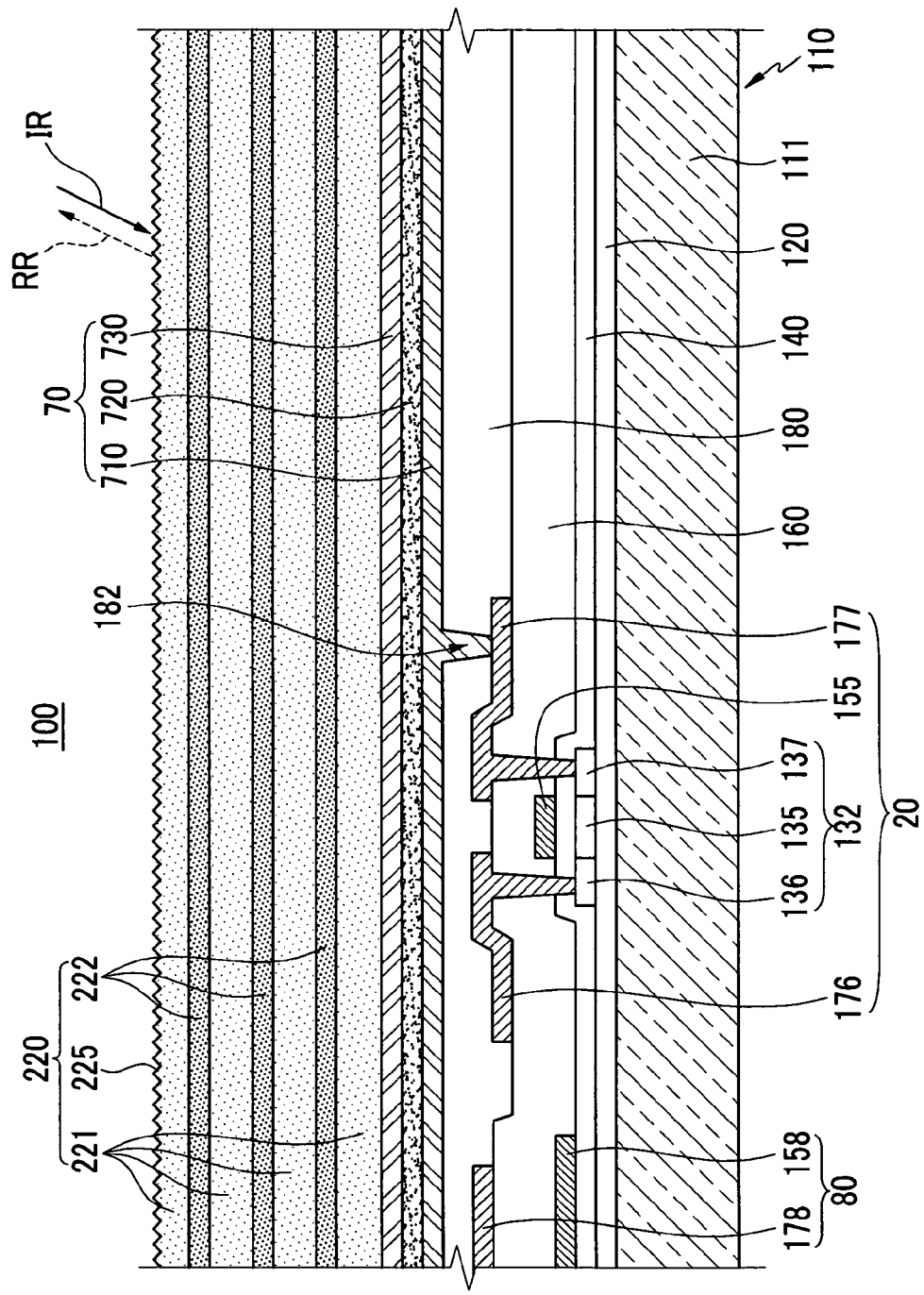

ORGANIC LIGHT EMITTING DIODE DISPLAY HAVING A CORNER-CUBE PATTERN COVER LAYER

CLAIM OF PRIORITY

This application makes reference to, incorporates the same herein, and claims all benefits accruing under 35 U.S.C §119 from an application for ORGANIC LIGHT EMITTING DIODE DISPLAY earlier filed in the Korean Intellectual Property Office on 23 Dec. 2008 and there duly assigned Serial No. 10-2008-0132375.

BACKGROUND OF THE INVENTION

1. Field of the Invention

The present invention relates to an organic light emitting diode (OLED) display. More particularly, it relates to an OLED display having improved visibility.

2. Description of the Related Art

An OLED display includes a plurality of organic light emitting diodes (OLEDs) including hole injection electrodes, an organic light emission layer, and electron injection electrodes. Light is emitted by energy generated when excitons generated as electrons and holes are combined drop from an excited state to a ground state, and the OLED display displays an image by using the light.

Accordingly, the OLED display has self-luminance characteristics, and unlike a liquid crystal display (LCD), the thickness and weight thereof can be reduced since a separate light source is not required. Further, because the OLED display has high quality characteristics such as low power consumption, high luminance, and high reaction speed, the OLED display is appropriate for use in a mobile electronic device.

In general, at least one of the hole injection electrode and the electron injection electrode and other metal wires of the OLED display can reflect external light. When the OLED display is used in a bright place, expression of a black color and contrast are deteriorated due to reflection of the external light, thereby deteriorating visibility of the OLED display.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an OLED display having an advantage of improving visibility.

An OLED display according to an exemplary embodiment of the present invention includes a substrate member, an OLED including a first electrode formed on the substrate member, an organic emission layer formed on the first electrode, and a second electrode formed on the organic emission layer, and a cover layer formed on the second electrode and covering the OLED. The cover layer includes a cover main body and a corner-cube pattern formed on a side opposite a side that faces the second electrode among both sides of the cover main body.

The corner-cube pattern may include a plurality of corner-cubes protruded toward a direction opposite to a direction that faces the second electrode from the cover main body.

The corner-cubes may be trihedrons.

The OLED may emit light toward the cover layer direction to display an image.

The OLED display may further include a sealing member formed on the cover layer.

The cover layer may have a thickness in a range of 50 nm to 1000 nm.

The cover layer may be made of at least one of an organic material such as Alq3, TPD, PBD, m-MTDATA, TCTA, NPD, and NPB and an inorganic material such as silicon nitride (SiNx), silicon oxide (SiOx), and silicon oxynitride (SiOxNy).

The cover layer may be a multilayer where a plurality of organic layers and a plurality of inorganic layers are alternately stacked.

The cover layer may have a thickness in a range of 1 μm to 5 μm.

The cover layer may include an organic layer made of polymer and an inorganic layer made of at least one of silicon nitride (SiNx), silicon dioxide ($SiO_2$), silicon oxynitride (SiOxNy), and aluminum oxide ($Al_2O_3$).

According to the present invention, the OLED display can have improved visibility. In addition, the entire thickness of the OLED display can be slim.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 5 is a cross-sectional view of an OLED display according to a second exemplary embodiment of the present invention.

DETAILED DESCRIPTION OF THE INVENTION

Figure 1:
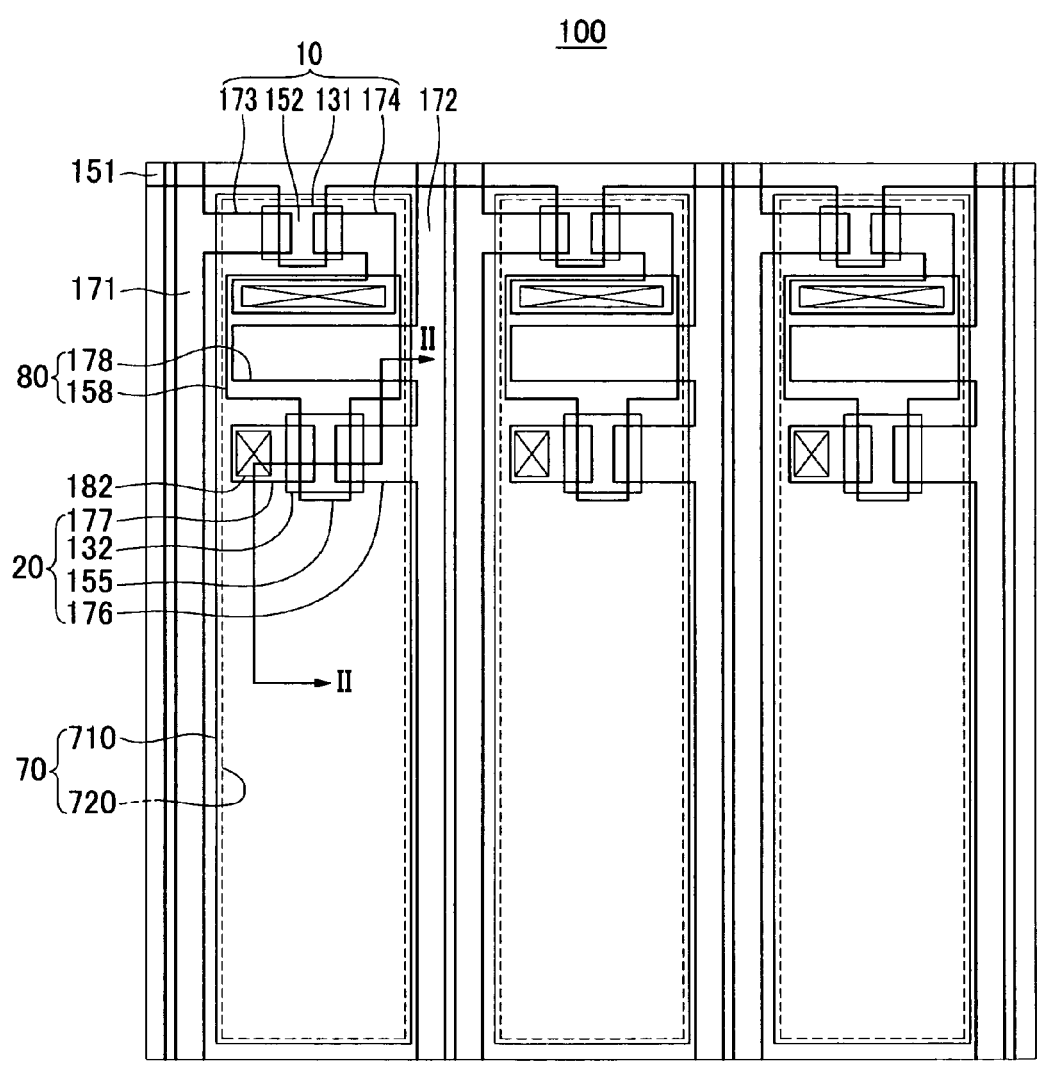
FIG. 1 is a layout view of an organic light emitting diode (OLED) display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, the size and thickness of each element in the drawing are random samples for better understanding and ease of description, and the present invention is not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The drawings and description are to be regarded as illustrative in nature and not restrictive. Like reference numerals designate like elements throughout the specification.

In the exemplary embodiments, constituent elements having the same configuration are representatively described in a first exemplary embodiment by designating like constituent elements thereto, and other exemplary embodiments will be described only regarding differences from the first exemplary embodiment.

In addition, in the accompanying drawings, an organic light emitting diode (OLED) display is illustrated as an active matrix (AM)-type OLED display in a 2Tr-1 Cap structure in which two thin film transistors and one capacitor are formed in one pixel, but the present invention is not limited thereto. Therefore, the OLED display can have various structures. For example, three or more thin film transistors and two or more capacitors can be provided in one pixel of the OLED display, and separate wires can be further provided in the OLED display. Here, a pixel is a minimum unit for displaying an image, and the OLED display displays an image by using a plurality of pixels.

Hereinafter, a first exemplary embodiment of the present invention will be described with reference to FIG. 1 and FIG. 2.

Figure 2:
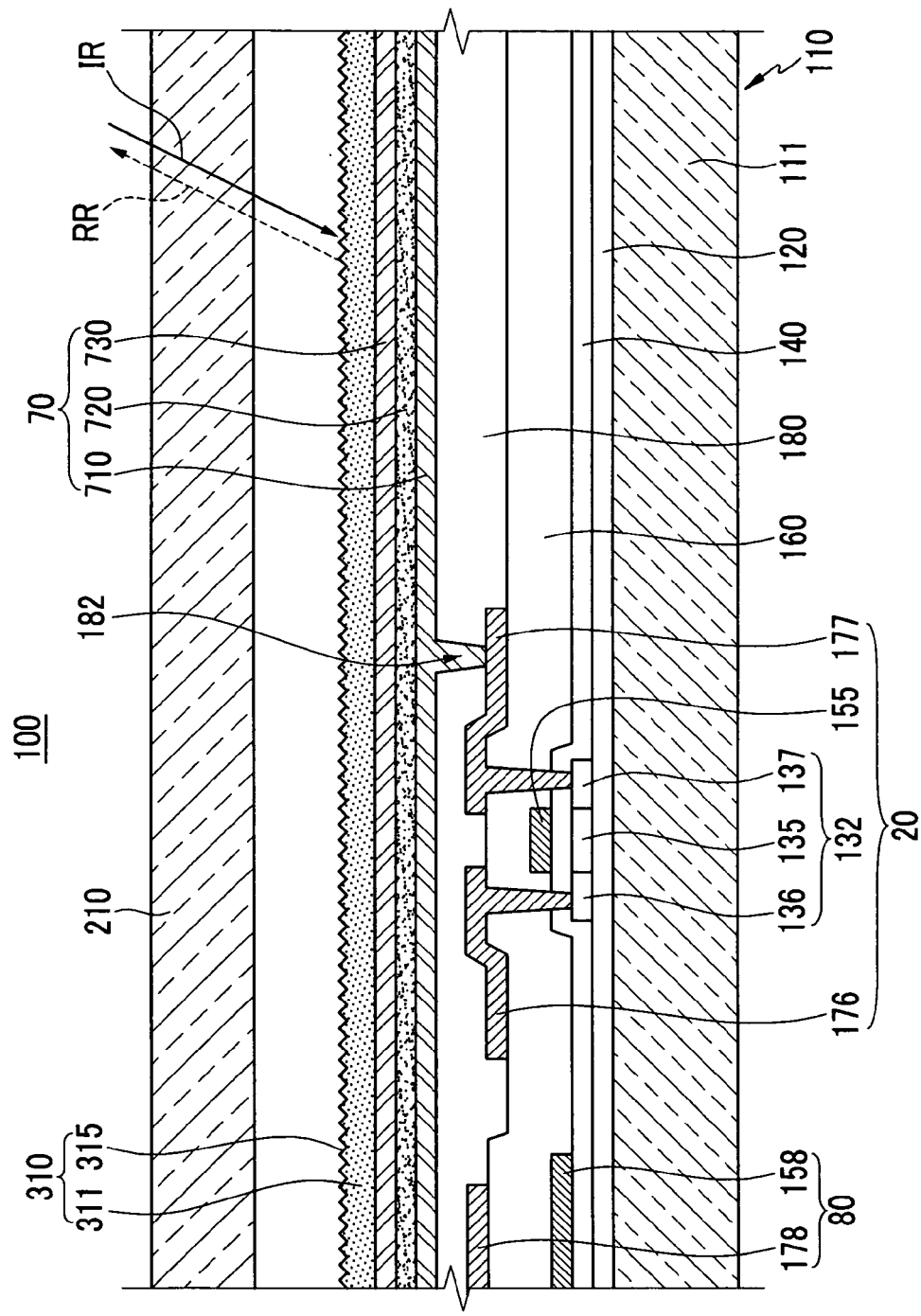
FIG. 2 is a cross-sectional view of FIG. 1, taken along the line II-II.

As shown in FIG. 1 and FIG. 2, an organic light emitting diode (OLED) display 100 includes a display substrate 110 and a sealing member 210. FIG. 1 is a layout view of a structure of a pixel, focusing on the display substrate 110. FIG. 2 is a cross-sectional view of the display substrate 110 and the sealing member 210 of FIG. 1, taken along the line II-II.

The display substrate 110 includes a switching thin film transistor 10, a driving thin film transistor 20, a capacitor 80, and an OLED 70 formed in each pixel on a substrate member 111. In addition, the display substrate 110 further includes gate lines 151 disposed along one direction, and data lines 171 and common power lines 172 that respectively cross the gate lines 151 and are insulated therefrom. Here, one pixel can be defined by a boundary of a gate line 151, a data line 171, and a common power line 172, but it is not limited thereto.

The OLED 70 includes a first electrode 710, an organic emission layer 720 formed on the first electrode 710, and a second electrode 730 formed on the organic emission layer 720. Here, the first electrode 710 is an positive (+) electrode which is a hole injection electrode, and the second electrode 730 is a negative (−) electrode which is an electron injection electrode. However, the present invention is not limited thereto, and thus the first electrode 710 can be the negative electrode and the second electrode 730 can be the positive electrode according to a driving method of the OLED display 100. Holes and electrons are respectively injected from the first electrode 710 and the second electrode 730 into the organic emission layer 720, and form excitons. When the excitons change from an excited state to a base state, light is emitted.

In addition, in the OLED display 100 according to the first exemplary embodiment of the present invention, the OLED 70 emits light toward a direction that is opposite to a direction of the first electrode 710 from the organic emission layer 720, that is, toward the second electrode 730, to display an image. That is, the OLED display 100 is formed as a top light emitting type.

The capacitor includes a first capacitive plate 158 and a second capacitive plate 178, with a gate insulating layer 140 interposed therebetween. Here, the gate insulating layer 140 becomes a dielectric material. The amount of charges charged in the capacitor 80 and a voltage between the first and second capacitive plates 158 and 178 determine capacitance of the capacitor 80.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The switching thin film transistor 10 is used as a switch for selecting a pixel to emit light. The switching gate electrode 152 is connected to the gate line 151. The switching source electrode 173 is connected to the data line 171. The switching drain electrode 174 is disposed at a distance from the switching source electrode 173 and is connected to the first capacitive plate 158.

The driving thin film transistor 20 applies driving power to the first electrode 710 for light emission of an organic emission layer 720 of an OLED 70 in a selected pixel. The driving gate electrode 155 is connected to the first capacitive plate 158. The driving source electrode 176 and the second capacitive plate 178 are respectively connected to the common power line 172. The driving drain electrode 177 is connected to the first electrode of the OLED 70 through a contact hole 182.

With the above-described structure, the switching thin film transistor 10 is driven by a gate voltage applied to the gate line 151 and transmits a date voltage applied to the data line 171 to the driving thin film transistor 2. A voltage corresponding to a voltage difference between a common voltage applied to the driving thin film transistor 20 from the common power line 172 and the data voltage transmitted from the switching thin film transistor 10 is stored in the capacitor 80, and a current corresponding to the voltage stored in the capacitor 80 flows to the OLED through the driving thin film transistor 20 so that the OLED 70 emits light.

In addition, the display substrate 110 further includes a cover layer 310 that is formed on the second electrode 730 to cover the OLED 70. The cover layer 310 includes a cover main body 311 and a corner-cube pattern 315 formed on a side opposite to a side of the cover main body 311, facing the second electrode 730.

The cover layer 310 basically protects the OLED 70 and simultaneously helps efficient emission of light generated from the OLED 70.

In addition, the corner-cube pattern 315 of the cover layer 310 reflects most of light externally transmitted to the cover layer 310 in parallel with the incident direction of the light. That is, incident light IR to the corner-cube pattern 315 of the cover layer 310 and reflection light RR reflected from the corner-cube pattern 315 are parallel with each other. In this case, since light reflected from the corner-cube pattern 315 is transmitted toward the outside in the same direction as the incident direction, reflection of the external light toward a user that faces the OLED display 100 is suppressed.

Therefore, visibility of the OLED display 100 can be improved. As described, deterioration of visibility of the OLED display 100 due to reflection of the external light can be suppressed by using the corner-cube pattern 315 of the cover layer 310.

In addition, the OLED display 100 does not require an additional element such as a polarizing member for suppressing reflection of external light, and therefore the configuration thereof can be simplified. Further, when the polarizing member is used for suppressing reflection of external light, a problem in loss of light emitted from the OLED 70 also can be solved.

The sealing member 210 is disposed opposite to the display substrate 110 to seal the thin film transistors 10 and 20, the capacitor 80, and the OLED 70 from the external environment by covering them. In addition, the light externally transmitted to the cover layer 310 is light that has passed through the sealing member 210 and transmitted to the display substrate 110.

Hereinafter, a structure of the OLED display 100 according to the first exemplary embodiment of the present invention will be described in further detail in a stack order. In addition, a structure of a thin film transistor will be described with respect to the driving thin film transistor 20. Further, the description of the switching thin film transistor 10 will focus only on differences from the driving thin film transistor.

First, the display substrate 110 will be described. The substrate member 111 is formed as an insulation substrate that is made of glass, quartz, ceramic, plastic, etc. However, the present invention is not limited thereto. Therefore, the substrate member 111 can be formed as a metal substrate that is made of stainless steel.

A buffer layer 120 is formed on the substrate member 111. The buffer layer 120 prevents impurities from permeating and planarizes a surface thereof, and is made of various materials for performing such functions. For example, one of a silicon nitride (SiNx) layer, a silicon dioxide (SiO$_2$) layer, and a silicon oxynitride (SiOxNy) layer can be used as the buffer layer 120. However, the buffer layer 120 is not always necessary, and may be omitted according to type and process conditions of the substrate member 111.

The driving semiconductor layer 132 is formed on the buffer layer 120. The driving semiconductor layer 132 is formed as a polysilicon layer. In addition, the driving semiconductor layer 132 includes a channel region 135 in which impurities are not doped, and a source region 136 and a drain region 137 that are doped with p+ impurities at respective sides of the channel region 135. In this case, a doped ion material is a P-type impurity such as boron (B), and B$_2$H$_6$ is generally used as the doped ion material. The impurity changes in accordance with the type of thin film transistor.

In the first exemplary embodiment of the present invention, a PMOS-structured thin film transistor using the P-type impurity is used as the driving thin film transistor 20, but is not limited thereto Therefore, a NMOS-structured thin film transistor or a CMOS-structured thin film transistor can be used as the driving thin film transistor 20.

In addition, although the driving film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The gate insulation layer 140 made of silicon nitride (SiNx) or silicon dioxide (SiO$_2$) is formed on the driving semiconductor layer 132. A gate wire including the driving gate electrode 155 is formed on the gate insulating layer 140. The gate wire further includes the gate line 151, the first capacitive plate 158, and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulating layer 140, the interlayer insulating layer 160 is made of a ceramic-based material such as silicon nitride (SiNx) or silicon dioxide (SiO$_2$).

A data wire including the driving source electrode 176 and the driving drain electrode 177 is formed on the interlayer insulating layer 160. The data wire further includes the data line 171, the common power line 172, the second capacitive plate 178, and other wires. In addition, the driving source electrode 176 and the driving drain electrode 177 are respectively connected to the source region 136 and the drain region 137 of the driving semiconductor layer 132 through the through-holes respectively formed in the interlayer insulation layer 160 and the gate insulation layer 140.

As described, the driving thin film transistor 20 including the driving semiconductor layer 132, the driving gate electrode 155, the driving source electrode 176, and the driving drain electrode 177 is formed. A configuration of the driving thin film transistor 20 is not limited to the above-described embodiment, and can be variously modified with a disclosed configuration that can be realized by a person of ordinary skill in the art.

A planarization layer 180 that covers the data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 can be made of at least one of polyacrylate resin, epoxy resin, phenolic resin, polyamide resin, polyimide resin, unsaturated polyester resin, polyphenylene ether resin, polyphenylene sulfide resin, and benzocyclobutene (BCB).

The first exemplary embodiment of the present invention is not limited to the above-described structure, and one of the planarization layer 180 and the interlayer insulating layer 160 can be omitted as necessary.

The first electrode 710 of the organic light emitting element 70 is formed on the planarization layer 180. That is, in the OLED display 100, a plurality of pixel electrodes 710 are disposed in each of the respective pixels. In this case, the plurality of first electrodes 710 are respectively disposed at a distance from each other. The first electrode 710 is connected to the drain electrode 177 through the contact hole 182 of the planarization layer 180.

In addition, a pixel defining layer 190 having an opening that exposes the pixel electrodes 710 is formed on the planarization layer 180. That is, the pixel defining layer 190 includes a plurality of openings formed in each pixel. In addition, the first electrode 710 is disposed to correspond to the opening of the pixel defining layer 190. That is, the first electrode 710 may be disposed under the pixel defining layer 190 to be partially overlapped by the pixel defining layer 190. The pixel defining layer 190 can be made of an inorganic material of a resin or silica group such as polyacrylate resin and polyimide.

The organic emission layer 720 is formed on the first electrode 710, and the second electrode 730 is formed on the organic emission layer 720. As described, the OLED 70 including the pixel electrode 710, the organic emission layer 720, and the common electrode 730 is formed.

The organic emission layer 720 is made of a low-molecular organic material or a high-molecular organic material. The organic emission layer 720 is formed in a multi-layer structure including at least one of a hole injection layer (HIL), a hole transport layer (HTL), an emission layer, an electron transport layer (ETL), and an electron injection layer (EIL). When the organic emission layer 720 is formed in a multi-layer structure including all the layers HIL, HTL, ETL, and EIL, the HIL is formed on the pixel electrode 710 which is a positive electrode, and the HTL, ETL, and EIL are sequentially stacked thereon.

In addition, in FIG. 2, the organic emission layer 720 is disposed only in the opening of the pixel defining layer 190 according to the first exemplary embodiment of the present invention, but it is not limited thereto. That is, the organic emission layer 720 can be formed not only on the first electrode 170 in the opening of the pixel defining layer 190 but also between the pixel defining layer 190 and the second electrode 730. In further detail, the organic emission layer 720 can further include several layers including an emission layer, an HIL, an HTL, an ETL, and an EIL. In this case, like the second electrode 730, excluding the emission layer, the HIL, HTL, ETL, and EIL can be formed not only on the first electrode 710 but also on the pixel defining layer 190 by using an open mask in a manufacturing process. That is, at least one of the layers included in the organic emission layer 720 can be interposed between the pixel defining layer 190 and the second electrode 730.

Each of the first electrode 710 and the second electrode 730 may be made of a transparent conductive material or a reflective or reflective conductive material. According to materials that form the first electrode 710 and the second electrode 730, the OLED display 100 can be classified as a top light emitting type, a bottom light emitting type, and a dual-side light emitting type.

The OLED display 100 according to the first exemplary embodiment of the present invention is a top light emitting type of OLED display. That is, the OLED emits light toward the cover layer 310 to display an image.

For the transparent conductive material, indium tin oxide (ITO), indium zinc oxide (IZO), zinc oxide (ZnO), or indium oxide (In2O3) may be used. For the reflective or transflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) may be used.

Figure 3:
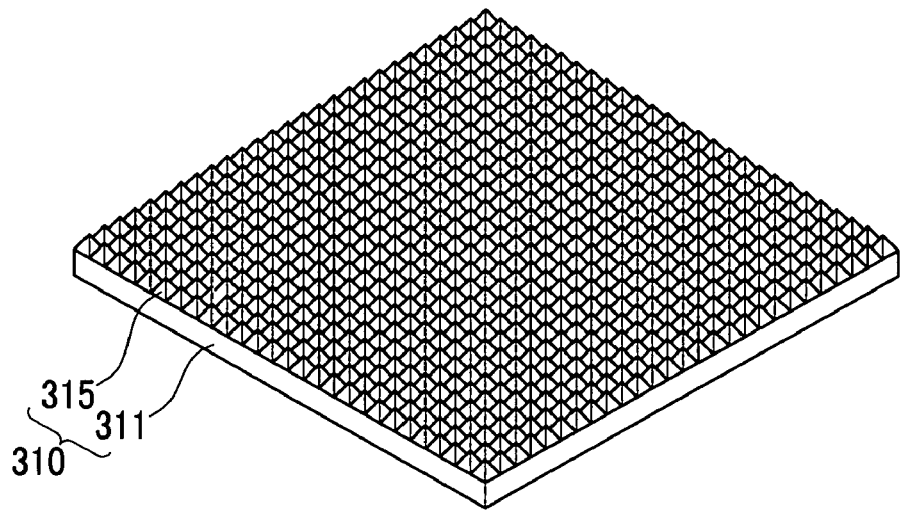
FIG. 3 is a perspective view of a cover layer where a corner-cube pattern is formed.
Figure 4:
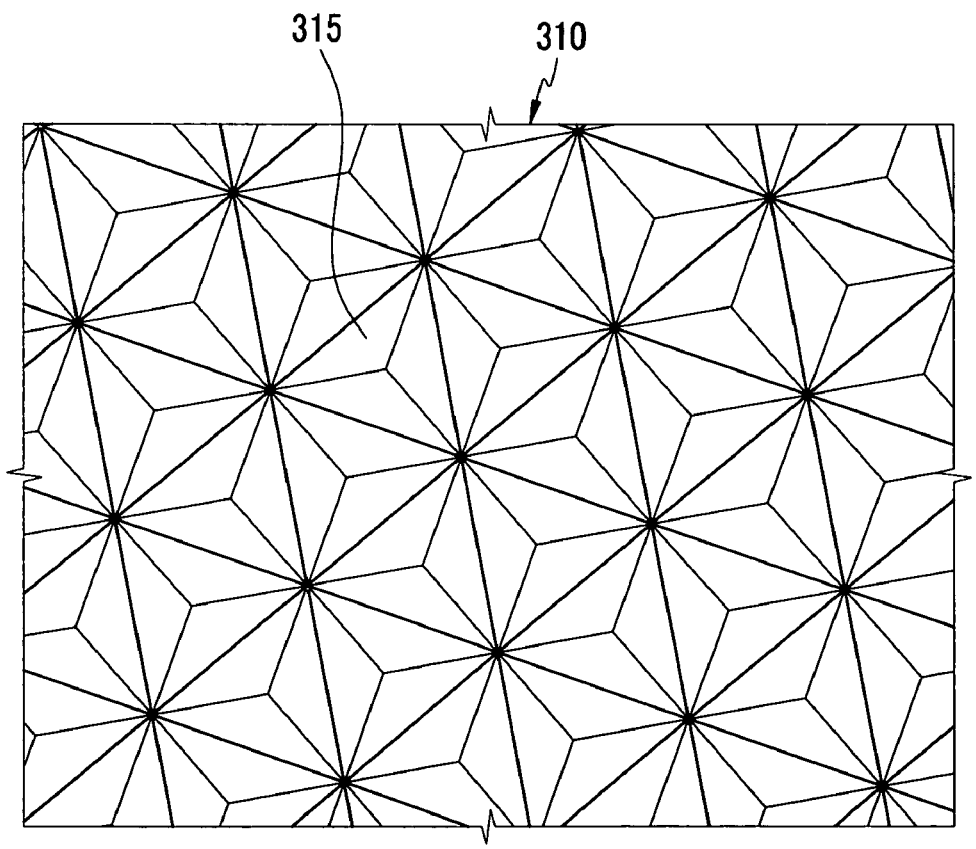
FIG. 4 is a top plan view of the corner-cube pattern of FIG. 3.

The cover layer 310 is formed on the second electrode 730. The cover layer 310, as shown in FIG. 3 and FIG. 4, includes the cover main body 311 and the corner-cube pattern 315 formed one side of the cover main body 311.

The cover layer 310 is formed as a single layer, and has a thickness in a range between 50 nm to 1000 nm. If the cover layer 310 is thinner than 50 nm, it is difficult to safely protect the OLED 70 and difficult to form the corner-cube pattern 315. On the contrary, if the cover layer 310 is thicker than 1000 nm, productivity may be deteriorated.

In addition, the cover layer 310 includes at least one of an organic material such as Alq3, TPD, PBD, m-MTDATA, TCTA, NPD, and NPB and an inorganic material such as silicon nitride (SiNx), silicon oxide (SiOx), and silicon oxynitride (SiOxNy). Here, the organic material such as Alq3, TPD, PBD, m-MTDATA, TCTA, NPD, and NPB may be used as a material of the organic emission layer 720.

The corner-cube pattern 315 is formed on a side that faces the second electrode 730 among both sides of the cover main body 311. In further detail, the corner-cube pattern 315 includes a plurality of corner-cubes formed along a direction opposite to a direction that faces the second electrode 730 from the cover main body 311, that is, a direction of the sealing member 210.

A corner-cube is a trihedral structure having unique optical characteristics in that an incident beam or incident light entering the effective aperture is reflected in an incident direction without regard to incident angle. In other words, the corner-cube is a cube with a cut-off corner, that is, it has a triangular pyramid shape. The corner-cube pattern 195 formed of the corner-cubes is formed in a micro-unit pattern on one side of the cover main body 311.

In addition, the corner-cube pattern 315 may be formed by various known methods. For example, the corner-cube pattern 195 may be formed by performing fine grinding and polishing of a drawn hexagonal stainless pin with a desired size and a desired angle to make surface roughness of a quarter of a visible ray wavelength, or may be formed with a mold having a pattern formed by the above-described method. In addition, the corner-cube pattern 315 may be formed by performing laser ablation with an excimer laser.

The sealing member 210 is formed on the cover layer 310, facing the cover layer 310. The sealing member 210 is made of a transparent material such as glass and plastic. The sealing member 210 is bonded to the display substrate 110 through a sealing material (not shown) formed along the edges thereof.

With the above-described configuration, visibility of the OLED display 100 can be improved.

Hereinafter, a second exemplary embodiment of the present invention will be described with reference to FIG. 5.

As shown in FIG. 5, in an OLED display 200 according to the second exemplary embodiment of the present invention, a cover layer 220 is formed as a multilayer where a plurality of organic layers 221 and a plurality of inorganic layers 222 are alternately stacked. That is, the cover layer 220 includes a plurality of organic layers 221, a plurality of inorganic layers 222, and a corner-cube pattern 225 formed on an upper layer of the plurality of organic and inorganic layers 221 and 222. Here, the upper layer refers to a layer that is opposite to a layer that faces the second electrode 730 of the OLED 70.

The organic layer 221 included in the cover layer 220 is made of a polymer. In addition, the inorganic layer 222 included in the cover layer 220 is one of silicon nitride (SiNx), silicon dioxide ($SiO_2$), silicon oxynitride (SiOxNy), and aluminum oxide ($Al_2O_3$).

A corner-cube pattern 225 of the cover layer 220 reflects most of incident light to the cover layer 220 from the external environment toward the incident direction in parallel. That is, incident light IR to the corner-cube pattern 225 of the cover layer 220 and reflection light RR reflected from the corner-cube pattern 225 are parallel with each other. In this case, since light reflected from the corner-cube pattern 225 is transmitted toward the outside in the same direction as the incident direction, reflection of the external light toward a user that faces the OLED display 200 is suppressed. Therefore, the OLED display 220 can have improved visibility. A structure of the corner-cube pattern 225 is the same as the corner-cube pattern 315 of the first exemplary embodiment.

In addition, in the second exemplary embodiment of the present invention, the cover layer 220 improves visibility of the OLED display 200 and seals thin film transistors 10 and 20, a capacitor 80, and an OLED for protection. That is, the cover layer 220 performs substantially the same function as that of the sealing member 210 included in the OLED display 100 of the first exemplary embodiment of the present invention.

In addition, the cover layer 220 has a thickness within a range of 1 μm to 5 μm. When the cover layer 220 is thinner than 1 μm, the cover layer 200 cannot perform like the sealing member 210 of FIG. 2. When the cover layer 220 is thicker than 5 μm, the entire thickness of the OLED display 200 may be influenced. In FIG. 5, the cover layer 220 is illustrated to be relatively thicker than the substrate member 111, but it is exaggerated for better understanding and ease of description.

With the above-described configuration, visibility of the OLED display 200 can be improved. In addition, the entire thickness of the OLED display 200 is reduced so that the OLED display 200 can be slimmer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate member;
   an OLED including a first electrode formed on the substrate member, an organic emission layer formed on the first electrode, and a second electrode formed on the organic emission layer; and
   a cover layer formed on the second electrode and covering the OLED,
   wherein the cover layer comprises a cover main body and a corner-cube pattern formed on a side opposite a side that faces the second electrode among both sides of the cover main body,
   wherein the cover layer is a multilayer where a plurality of organic layers and a plurality of inorganic layers are alternately stacked,
   wherein the cover layer has a thickness in a range of 1 μm to 5 μm.

2. The OLED display of claim 1, wherein the OLED emits light toward the cover layer direction to display an image.

3. The OLED display of claim 1, further comprising a sealing member formed on the cover layer.

4. The OLED display of claim 1, wherein the cover layer is made of at least one of an organic material such as Alq3, TPD, PBD, m-MTDATA, TCTA, NPD, and NPB and an inorganic material such as silicon nitride (SiNx), silicon oxide (SiOx), and silicon oxynitride (SiOxNy).

5. The OLED display of claim 1, wherein the cover layer comprises an organic layer made of polymer and an inorganic layer made of at least one of silicon nitride (SiNx), silicon dioxide ($SiO_2$), silicon oxynitride (SiOxNy), and aluminum oxide ($Al_2O_3$).

6. The OLED display of claim 1, wherein the corner-cube pattern comprises a plurality of corner-cubes protruded toward a direction opposite to a direction that faces the second electrode from the cover main body.

7. The OLED display of claim 6, wherein the corner-cubes are trihedrons.

8. An organic light emitting diode (OLED) display comprising:
   a substrate member;
   an OLED including a first electrode formed on the substrate member, an organic emission layer formed on the first electrode, and a second electrode formed on the organic emission layer; and
   a cover layer formed on the second electrode and covering the OLED,
   wherein the cover layer comprises a cover main body and a corner-cube pattern formed on a side opposite a side that faces the second electrode among both sides of the cover main body, said corner-cube pattern formed of a plurality of identical triangular pyramid shapes,
   wherein each of the plurality of identical triangular pyramid shapes has three sides and a triangular base with the sides angled with respect to the triangular base to reflect light in a same direction as an incident direction of said light and suppressing light reflected toward a user facing said OLED display, and
   no film is covering, the plurality of identical triangular pyramid shapes.

9. The OLED display of claim 8, wherein the OLED emits light toward the cover layer direction to display an image.

10. The OLED display of claim 8, wherein the corner-cube pattern comprises a plurality of corner-cubes protruded toward a direction opposite to a direction that faces the second electrode from the cover main body.

11. The OLED display of claim 10, wherein the corner-cubes are trihedrons.

12. The OLED display of claim 8, further comprising a sealing member formed on the cover layer.

13. The OLED display of claim 12, wherein the cover layer has a thickness in a range of 50 nm to 1000 nm.

14. The OLED display of claim 13, wherein the cover layer is made of at least one of an organic material such as Alq3, TPD, PBD, m-MTDATA, TCTA, NPD, and NPB and an inorganic material such as silicon nitride (SiNx), silicon oxide (SiOx), and silicon oxynitride (SiOxNy).

15. An organic light emitting diode (OLED) display comprising:
   a substrate member;
   an OLED including a first electrode formed on the substrate member, an organic emission layer formed on the first electrode, and a second electrode formed on the organic emission layer; and
   a cover layer formed on the second electrode and covering the OLED,
   wherein the cover layer comprises a cover main body and a corner-cube pattern formed on a side opposite a side that faces the second electrode among both sides of the cover main body, said corner-cube pattern formed of a plurality of identical triangular pyramid shapes reflecting light in a same direction as an incident direction of said light and suppressing light reflected toward a user facing said OLED display,
   wherein the cover layer is a multilayer where a plurality of organic layers and a plurality of inorganic layers are alternately stacked, and
   no film is covering the plurality of identical triangular pyramid shapes.

16. The OLED display of claim 15, wherein the cover layer has a thickness in a range of 1 μm to 5 μm.

17. The OLED display of claim 16, wherein the cover layer comprises an organic layer made of polymer and an inorganic layer made of at least one of silicon nitride (SiNx), silicon dioxide ($SiO_2$), silicon oxynitride (SiOxNy), and aluminum oxide ($Al_2O_3$).

* * * * *